(12) United States Patent
Wyse

(10) Patent No.: US 8,660,514 B1
(45) Date of Patent: Feb. 25, 2014

(54) MULTIPLE MODE RF CIRCUIT

(75) Inventor: Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/438,524

(22) Filed: Apr. 3, 2012

(51) Int. Cl.
*H04B 1/26* (2006.01)

(52) U.S. Cl.
USPC .......................... 455/326; 455/333; 327/356

(58) Field of Classification Search
USPC ........ 455/91, 102, 112, 113, 115.1, 118, 126, 455/127.1, 234, 323, 330, 333, 326; 327/355–359
See application file for complete search history.

(56) References Cited

U.S. PATENT DOCUMENTS

| | | | |
|---|---|---|---|
| 6,944,437 B2 * | 9/2005 | Yang et al. | 455/323 |
| 2008/0064344 A1 * | 3/2008 | Kuo et al. | 455/118 |

* cited by examiner

*Primary Examiner* — Thanh Le
(74) *Attorney, Agent, or Firm* — Donna P. Suchy; Daniel M. Barbieri

(57) ABSTRACT

A multiple mode RF circuit includes a switching network to switch the RF circuit between a mixer mode and amplifier mode of operation. Two differential amplifier stages coupled to a differential transistor pair form the core of the circuit. A differential local oscillator (LO) source is selectively coupled to the two differential amplifier stages for mixer operation by the switching network and a feedback loop is selectively coupled between the input of the differential transistor pair and the output of the two differential amplifier stages by the switching network for amplifier operation. Gain is controlled in both modes by varying the DC bias on the two differential amplifier stages so that partial cancellation of the amplified signal from the differential transistor pair occur at the RF output. The multiple mode RF circuit operates over a large dynamic range by adjusting a bias current to scale linearity.

19 Claims, 3 Drawing Sheets

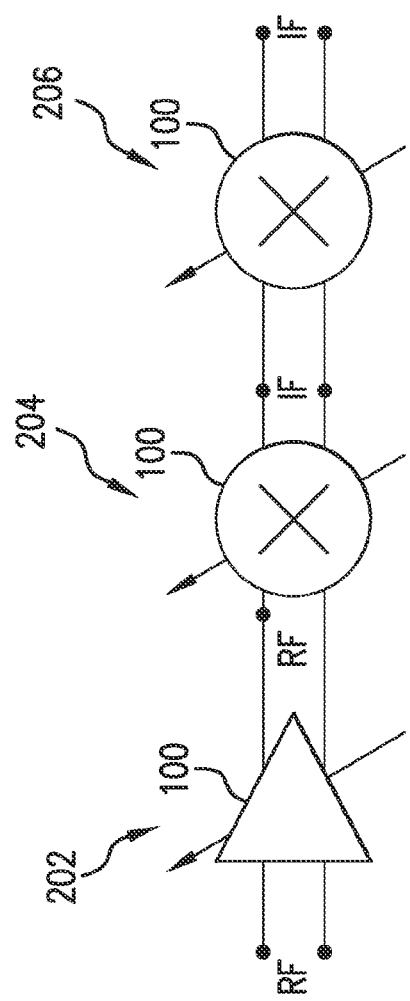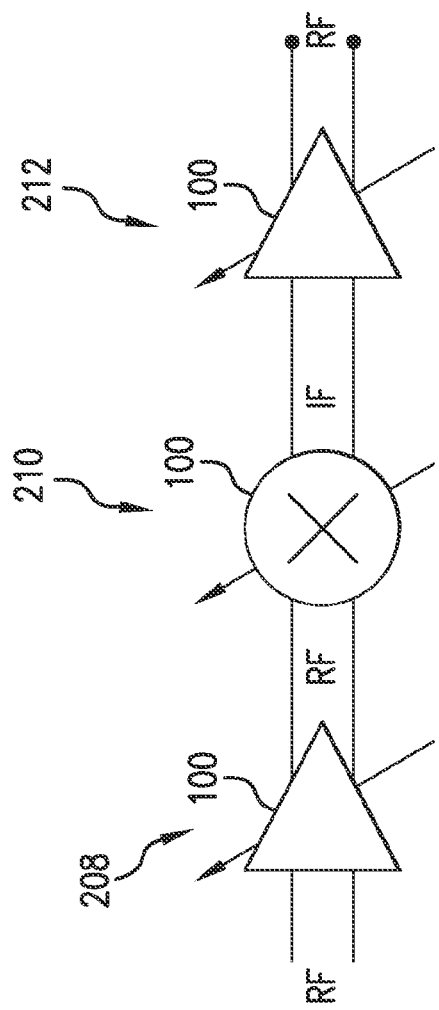

MULTIPLE MODE RF CIRCUIT

BACKGROUND

This invention relates to radio communications, and more specifically to a radio frequency (RF) circuit reconfigurable between an RF mixer with fixed gain, RF mixer with variable gain, an RF amplifier with fixed gain, an RF amplifier with variable gain, and scalable linearity and bias settings in every mode.

The backbone of all RF communication equipment is the RF mixer and the RF amplifier. Virtually, all RF equipment employs a combination of amplifiers and mixers. Amplifiers are useful to increase the power level of a signal of interest. In RF transmission, RF mixers are used to transpose radio frequencies to a useful signal for transmission and delivery at an intermediate frequency. Conversely, in reception, mixers are used to transpose the RF frequency of a received signal to a relatively low intermediate frequency for processing by downstream electronic circuits.

RF system designers are motivated to reduce size, weight, power, and cost of RF equipment. In that regard, considerable savings can be found with interchangeable and reconfigurable electrical components.

What is needed is a single electrical circuit or unit cell that is reconfigurable to an amplifier or a mixer, with variable gain and variable linearity control.

SUMMARY

According to the present invention, there is provided a multiple mode RF circuit. The RF circuit includes a switching network to switch the RF circuit between a mixer mode and amplifier mode of operation. Two differential amplifier stages coupled to a differential transistor pair form the core of the circuit. A differential local oscillator (LO) source is selectively coupled to the two differential amplifier stages for mixer operation by the switching network, and a feedback loop is selectively coupled between the input of the differential transistor pair and the output of the two differential amplifier stages by the switching network for amplifier operation. Gain is controlled in both modes by varying the DC bias on the two differential amplifier stages so that partial cancellation of the amplified signal from the differential transistor pair occurs at the RF output.

In mixer mode, the LO signal is coupled to the two differential amplifier stages and a pair of impedances are coupled by the switching network to the differential transistor pair to provide a controlled RF impedance at the input of the differential transistor pair.

In amplifier mode, the LO source is decoupled from the circuit and a pair of RF loads are coupled to the input for the two differential amplifier stages to provide a common-base amplifier stage. A feedback loop is coupled between the input of the differential transistor pair and the output of the two differential amplifier stages to provide feedback. The feedback controls the RF input and output impedance, stability, gain flatness, and the maximum gain setting for the amplifier.

In an embodiment, the multiple mode circuit is suitable for use in an RF radio. The multiple mode RF circuit in the RF radio includes at least one multiple mode RF circuit configured in either amplifier mode or mixer mode. Preferably, several multiple mode RF circuits are cascaded in various arrangements of mixers and amplifiers to move an RF input signal between frequency bands for optimum signal processing.

These and other aspects, features, and advantages of the invention will become apparent upon review of the following description taken in connection with the accompanying drawings. The invention, though, is pointed out with particularity by the appended claims.

BRIEF DESCRIPTION OF THE DRAWINGS

These and other more detailed and specific features of the present invention are more fully disclosed in the following specification, reference being had to the accompanying drawings.

FIG. 3A is a schematic diagram of three multi-mode circuits of FIG. 1 cascaded together and configured as a low noise amplifier, mixer, and a mixer.

FIG. 3B is a schematic diagram of three multi-mode circuits of FIG. 1 cascaded together and configured as a low noise amplifier, mixer, and a low noise amplifier.

DESCRIPTION OF ILLUSTRATIVE EMBODIMENTS

Radio frequency (RF) communications equipment generally employs a combination of mixers and amplifiers. Mixers are used for up-converting an intermediate frequency (IF) signal to a high-frequency signal or down-converting a high-frequency signal to an IF signal and may be used in both frequency conversion and frequency synthesis applications. Amplifiers are often used for converting a low-power RF signal to a larger signal or converting a larger signal to a low-power RF signal, the latter also being referred to as an attenuator.

Amplifiers and mixers are constructed with a combination of discrete components, including transistors. Transistors can be made using various fabrication technologies, such as silicon (SI) substrate, silicon-germanium (Si—Ge) substrate, gallium-arsenide (GaAs) substrate, or gallium-nitride (GaN) on a silicon substrate. Various types of transistors are available, including a bipolar terminal transistor (BJT), metallic oxide semiconductor (MOS), complementary metallic oxide semiconductor (CMOS), a bipolar CMOS (Bi-CMOS), heterojunction bipolar transistor (HBT), metal semiconductor field effect transistor (MES-FET) and high electron mobility transistor (HEMT). The described embodiment of the present invention is implemented as an HBT-based integrated circuit (IC); however, any of the foregoing fabrication technologies or transistor types can be employed, as can others.

Figure 1:
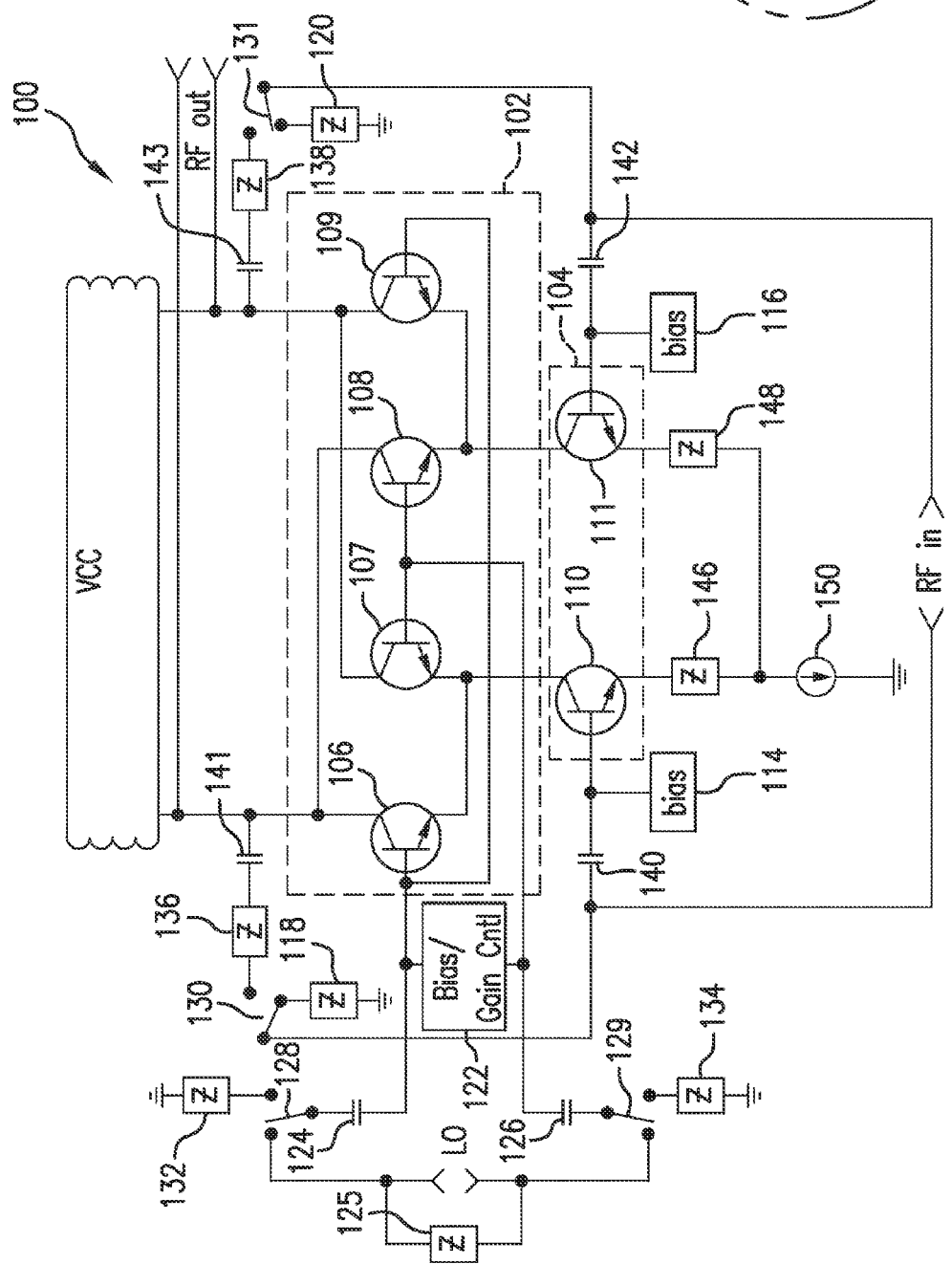
FIG. 1A is a schematic diagram of a multi-mode circuit in accordance with the present invention configured as a mixer.
FIG. 1B is a symbol for a typical HBT transistor.
Figure 2:
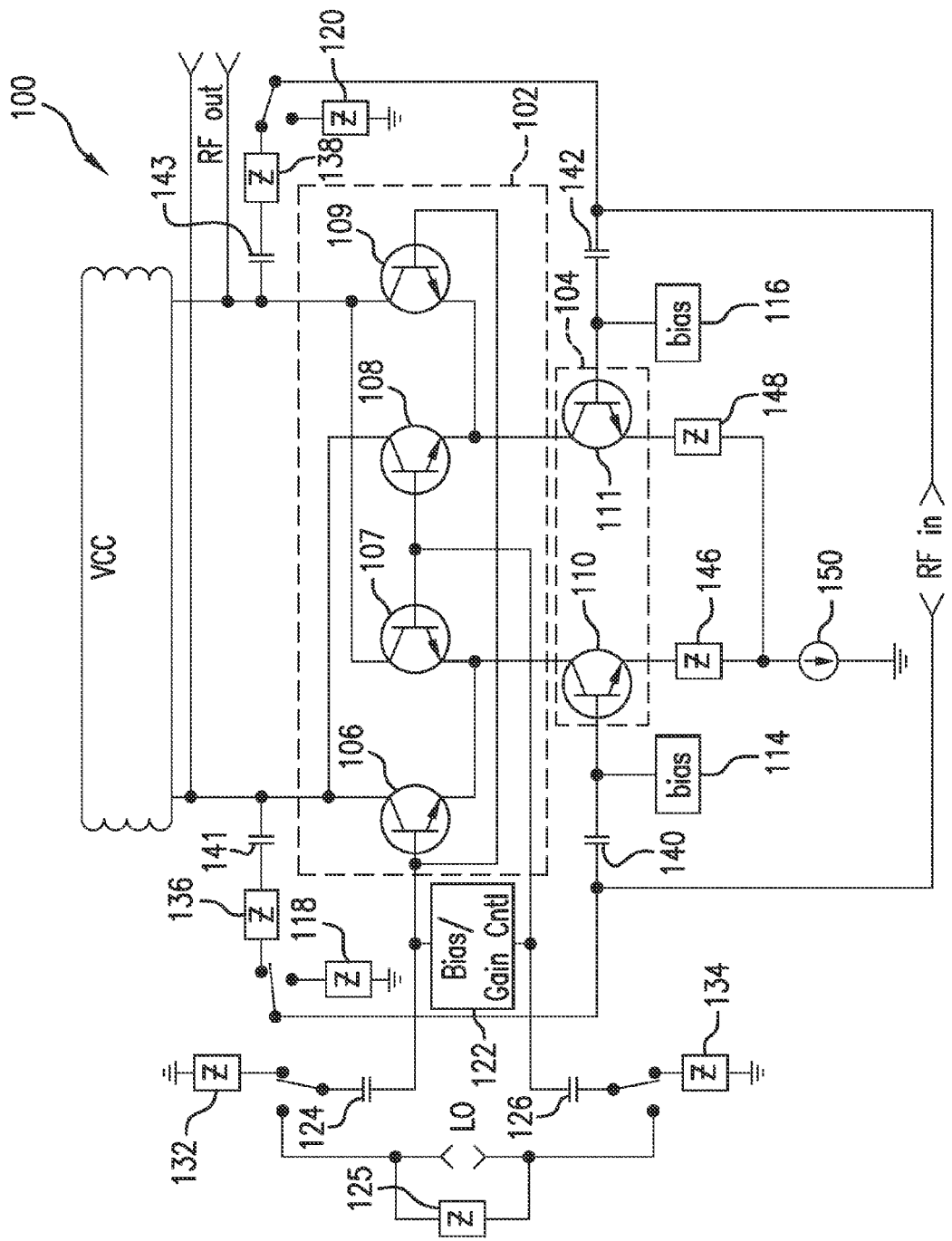
FIG. 2 is a schematic diagram of the multi-mode circuit of FIG. 1 configured as an amplifier.

FIGS. 1A and 2 show a schematic diagram of a multi-mode RF circuit 100. In FIG. 1A, multi-mode RF circuit 100 is configured as an RF mixer, whereas in FIG. 2, multi-mode RF circuit 100 is configured as an RF amplifier. A combination of switching and bias-shifting can move multi-mode RF circuit 100 between the mixer and amplifier modes, with or without variable gain, and across a wide range of bias and linearity.

FIG. 1B shows a typical transistor with a collector "c", a base "b", and an emitter "e".

FIG. 1A shows a quad-core transistor array 102 coupled to a differential transistor pair 104. In mixer mode, the combination of quad-core transistor array 102 and transistor pair 104 form a standard cell mixer. The mixer includes two differential amplifier stages formed by emitter-coupled transistor pairs 106, 107 and 108, 109. The collectors of a third differential transistor pair 110, 111, feed the emitter junctions of the two stages. The output currents of 110, 111 become the emitter currents for the two differential amplifier stages.

Quad-core transistor array 102 has dual pairs of HBTs: pair 106, 107 and pair 108, 109. The emitters of each of the dual pairs 106, 107 and 108, 109 are coupled, respectively. The collectors of transistors 106 and 108 and 107 and 109 are coupled, respectively. The bases of transistors 106 and 109 and 107 and 108 are coupled, respectively. Differential transistor pair 104 has the collector of each transistor 110, 111 coupled with the emitters of transistor pairs 106, 107 and 108, 109, respectively.

A differential RF signal is applied to the bases of transistors 110, 111 of differential transistor pair 104. A pair of RF terminations 118 and 120 provides a controlled RF impedance at the RF input ports.

Bias circuits 114 and 116, each coupled to one of the differential inputs of differential transistor pair 104, hold transistors 110, 111 in the active region of operation. Bias circuits 114 and 116 along with a current source 150 allows the alteration of the transconductance, i.e., the ratio of the current change at the output port to the voltage change at the input port or $g_m$, by modifying the emitter current of differential transistor pair 104. In that regard, bias circuits 114 and 116 and current source 150 can affect the total gain and dynamic range of multi-mode RF circuit 100, since an increase or decrease in the emitter current has a corresponding effect on the gain and linearity capability. The output of differential transistor pair 104 is provided to the differential input of quad-core transistor array 102 at the emitters of transistors 106, 107 and 108, 109.

A differential local oscillator (LO) signal is applied to the bases of transistor pairs 106, 109 and 107, 108. Capacitors 124 and 126, in series with the differential LO input, block the DC component of the LO signal, leaving a pure AC coupling of the LO signal. An impedance 125 in parallel with the LO input controls the input impedance for the LO signal. The LO signal provides one transistor in each pair with a higher transconductance than the other transistor for each half-cycle, thus alternating the transconductance of the transistors. The switching of the transistor pairs 106, 109 and 107, 108 mixes the LO signal with the differential RF signal received at the bases of one of the transistors in each pair 106, 107 and 108, 109 during each half-cycle to produce the differential IF or output signal at the coupled sources of transistor pairs 106, 108 and 107, 109.

A bias/gain control circuit 122 is provided across the differential LO input of quad-core transistor array 102. Bias/gain control circuit 122 holds the bias on the coupled bases of transistors 106, 109 and 107, 108 high enough to keep all the transistors in quad-core transistor array 102 operating in the active region. Bias/gain control circuit 122 provides a nominal DC voltage to ensure the quad-core transistor array 102 operates in the proper bias condition. Bias/gain control circuit 122 can also adjust the DC offset voltage between base-coupled transistor pairs 106, 109 and 107, 108. This offset voltage affects how the AC coupled LO signal impacts the transconductance of the collector-coupled transistor pairs 106,108 and 107,109. Increasing the offset voltage between base-coupled transistor pairs 106, 109 and 107, 108 causes current steering to occur at the collectors of collector-coupled transistor pairs 106,108 and 107,109 such that gain is controllable by adjusting the offset and producing a Variable Gain Mixer (VGM).

To move between mixer mode (shown in FIG. 1A) and amplifier mode (shown in FIG. 2), multi-mode RF circuit 100 employs a switching network, including dual pairs of switches 128, 129 and 130, 131. Switches 128, 129 disengage the LO input from quad-core transistor array 102 and AC couples the bases of transistor pairs 106, 109 or 107, 108 to an acceptable RF termination. Switches 130, 131 create a feedback loop for gain and impedance control by disengaging the controlled RF impedance at the RF input ports provided by RF terminations 118 and 120 and coupling the bases of transistors 110 and 111 in differential transistor pair 104 to the differential RF output of quad-core transistor array 102 through corresponding impedances 136 and 138. Dual pairs of capacitors 140, 141 and 142, 143 are coupled in the feedback loop to block DC components of the RF input and the RF output.

FIG. 2 shows multi-mode RF circuit 100 in amplifier mode. Bias circuits 114 and 116 operate in the same manner as previously described. Bias/gain control circuit 122 remains connected across the differential LO input of quad-core transistor array 102. Bias/gain control circuit 122 modifies the bias in a similar manner as previously described, but this time without the LO signal being AC coupled. The bias of each of the coupled transistor pairs 106, 109 and 107, 108 are modified with respect to each other effectively steer the collector current between transistor pairs 106, 109 and 107, 108, thereby creating a variable gain amplifier (VGA).

In amplifier mode, quad-core transistor array 102 and differential transistor pair 104 are cascode-coupled in two-stage amplification. The first stage of the cascode-coupling, the input stage, includes differential transistor pair 104 with its emitter coupled to a common node through impedances 146 and 148 and current drain 150. The second stage, the output stage, includes quad-core transistor array 102 with its bases AC coupled to the common node through impedances 132 and 134. Cascode-coupling of two amplification stages advantageously provides a wide bandwidth, high gain, and better controlled input impedance.

Multi-mode RF circuit 100 can be implemented as a field programmable gate array (FPGA) allowing multi-mode RF circuit 100 to be configured as a mixer or amplifier, with variable gain and linearity settings, by the designer in the field. As such, multi-mode RF circuit 100 is a single cell that can operate as a mixer and amplifier, with or without variable gain and across a wide linearity range. Multiple multi-mode RF circuits 100 can be cascaded together to allow the designer to move the RF input signal through multiple stages, so that the system is operable in a more desirable frequency band without surrounding interference. At each stage, the designer can modify the gain and control the saturation points and linearity, which improves the spurious free dynamic range of the entire cascaded circuit for a minimum amount of DC power consumption.

FIGS. 3A and 3B show two examples of the cascade flexibility of multi-mode RF circuit 100. FIG. 3A shows a three-stage system 202-206 with three multi-mode RF circuits 100 cascaded together. The first stage 202 has multi-mode RF circuit 100 configured as a variable gain amplifier, for example, functioning as a low-noise amplifier in the front-end of an RF receiver to process an RF signal. The second stage 204 has multi-mode RF circuit 100 configured as a mixer to down-convert the RF input. The third stage 206 has multi-mode RF circuit 100 configured as a mixer to further down-convert the RF input.

FIG. 3B shows a three-stage system 208-212 with three multi-mode RF circuits 100 cascaded together to process an RF signal. The first stage 208 has multi-mode RF circuit 100 configured as a variable gain amplifier. The second stage 210 has multi-mode RF circuit 100 configured as a mixer to down-convert the RF input. The third stage 212 has multi-mode RF circuit 100 configured as an amplifier. Any number of different embodiments can be created by combining any number of multi-mode RF circuits 100 in different configurations and arrangements.

While the present invention has been particularly shown and described with reference to exemplary embodiments thereof, it should be understood by those of ordinary skill in the art that various changes, substitutions and alterations can be made herein without departing from the scope of the invention as defined by appended claims and their equivalents.

What is claimed is:

1. A multiple mode RF circuit, comprising:
   a quad-core transistor array having an RF input, a local oscillator (LO) input, and an RF output;
   a differential transistor pair having an RF input and an RF output coupled to the RF input of the quad-core transistor array;
   a first pair of switches coupled between an RF output of the quad-core transistor array and the RF input of the differential transistor pair to selectively provide feedback for the differential transistor pair;
   a second pair of switches to selectively couple a LO signal to the LO input of the quad-core transistor array; and
   wherein, the multiple mode RF circuit has a mixer mode wherein feedback between the RF output of the quad-core transistor array and the RF input of the differential transistor pair is decoupled by the first pair of switches and the LO signal is coupled to the LO input of the quad-core transistor array by the second pair of switches, and an amplifier mode wherein feedback between the RF output of the quad-core transistor array and the RF input of the differential transistor pair is coupled by the first pair of switches and the LO signal is decoupled from the LO input of the quad-core transistor array by the second pair of switches.

2. The multiple mode RF circuit of claim 1, and further comprising:
   a gain control circuit coupled to the LO input of the quad-core transistor array to modify a gain of the multiple mode RF circuit by adjusting a DC offset voltage in the quad-core transistor array.

3. The multiple mode RF circuit of claim 2, wherein the multiple mode RF circuit has a variable gain mixer (VG Mixer) mode with the gain of the VG Mixer adjusted with the gain control circuit.

4. The multiple mode RF circuit of claim 2, wherein the multiple mode RF circuit has a variable gain amplifier (VGA) mode with the gain of the VGA adjusted with the gain control circuit.

5. The multiple mode RF circuit of claim 1, wherein the quad-core transistor array includes two differential amplifier stages formed by a first emitter-coupled transistor pair and a second emitter-coupled transistor pair, wherein each transistor in the first emitter-coupled transistor pair has a collector coupled to a collector of one of the transistors in the second emitter-coupled transistor pair, and wherein each transistor in the first emitter-coupled transistor pair has a base coupled to a base of one of the transistors in the second emitter-coupled transistor pair.

6. The multiple mode RF circuit of claim 5, and further comprising a gain control circuit coupled to the LO input of the first and the second emitter-coupled transistor pair to selectively adjust a DC offset voltage across the base and the emitter of each of the transistors in the first and the second emitter-coupled transistor pairs in order to modify a gain produced by the first and the second emitter-coupled transistor pairs.

7. The multiple mode RF circuit of claim 6, wherein the gain control circuit changes the DC offset voltage across the base and the emitter of one of the first and the second emitter-coupled transistor pairs with respect to the other emitter-coupled transistor pair to steer a current between the first and the second emitter-coupled transistor pairs.

8. The multiple mode RF circuit of claim 6, and further comprising a first voltage bias circuit coupled to the differential transistor pair for adjusting a bias voltage of each of the transistors in the differential transistor pair to maintain the differential transistor pair in an active region of operation.

9. The multiple mode RF circuit of claim 8, wherein the bias voltage of the differential transistor pair is modified to change the gain of the multiple mode RF circuit.

10. The multiple mode RF circuit of claim 1, and further comprising:
    a gain control circuit coupled to the LO input of the quad-core transistor array to provide a DC bias voltage that holds each transistor in the quad-core transistor array in an active region of operation; and
    a current source to modify a dynamic range and a DC power consumption of the multiple mode RF circuit.

11. A multiple mode RF circuit, comprising:
    a switching network;
    two differential amplifier stages having an input and an output;
    a differential transistor pair having an input and an output, wherein the output is coupled to the input of the two differential amplifier stages;
    a differential local oscillator (LO) source selectively coupled to the two differential amplifier stages by the switching network;
    a feedback loop selectively coupled between the input of the differential transistor pair and the output of the two differential amplifier stages by the switching network, wherein the multiple mode RF circuit has a mixing mode where the LO source is coupled to the two differential amplifier stages by the switching network and the feedback loop is not coupled between the input of the differential transistor pair and the output of the two differential amplifier stages by the switching network, and wherein the multiple mode RF circuit has an amplifier mode where the LO source is not coupled to the two differential amplifier stages by the switching network and the feedback loop is coupled between the input of the differential transistor pair and the output of the two differential amplifier stages by the switching network.

12. The multiple mode RF circuit of claim 11, wherein the two differential amplifier stages includes a first and a second emitter-coupled transistor pair having an RF input, a local oscillator (LO) input, and an RF output.

13. The multiple mode RF circuit of claim 12, wherein each transistor in the first emitter-coupled transistor pair has a collector coupled to a collector of one of the transistors in the second emitter-coupled transistor pair, and wherein each transistor in the first emitter-coupled transistor pair has a base coupled to a base of one of the transistors in the second emitter-coupled transistor pair.

14. The multiple mode RF circuit of claim 13, wherein each transistor in the differential transistor pair has a collector coupled to an emitter of one of the first and the second emitter-coupled transistor pairs.

15. The multiple mode RF circuit of claim 14, and further comprising:
    a gain control circuit coupled to the LO input of the first and the second emitter-coupled transistor pairs to selectively adjust a DC offset voltage across the base and the emitter of each of the transistors in the first and the second emitter-coupled transistor pairs in order to modify the gain produced by the first and the second emitter-coupled transistor pairs; and a current source to modify a dynamic range and a DC power consumption of the multiple mode RF circuit.

16. The multiple mode RF circuit of claim 15, and further comprising a voltage bias circuit coupled to the differential transistor pair for adjusting a bias voltage of each of the transistors in the differential transistor pair to maintain the differential transistor pair in an active region of operation.

17. The multiple mode RF circuit of claim 15, and further comprising a first pair of impedances coupled to the first and the second emitter-coupled transistor pairs by the switching network when the multiple mode RF circuit is in amplifier mode and decoupled by the switching network when the multiple mode RF circuit is in mixer mode; and a second pair of impedances coupled by the switching network to the differential transistor pair when the multiple mode RF circuit is in mixer mode to provide a controlled RF impedance at the input of the differential transistor pair and decoupled by the switching network when the multiple mode RF circuit is in amplifier mode.

18. An RF radio comprising:
at least one of a transmit and receive channel to process an RF signal;
at least one multiple mode RF circuit implemented as a unit cell and selectively configured as one of an amplifier mode and a mixer mode, and including a switching network to selectively move the multiple mode RF circuit between the mixer mode and the amplifier mode, wherein the at least one multiple mode RF circuit includes:

a first and a second emitter-coupled transistor pair coupled to a differential transistor pair; and
a gain control circuit coupled to an input to the first and the second emitter-coupled transistor pair to selectively adjust a DC offset voltage across a base and a emitter of each of the transistors in the first and the second emitter-coupled transistor pairs in order to modify a gain produced by the first and the second emitter-coupled transistor pairs, wherein the gain control circuit changes the DC offset voltage across the base and the emitter of one of the first and the second emitter-coupled transistor pairs with respect to the other emitter-coupled transistor pair to steer a current between the first and the second emitter-coupled transistor pairs; and
a first input of the multiple mode RF circuit to receive an RF input signal, wherein the multiple mode RF circuit receives the RF input signal and supplies a modified RF input signal to the at least one of the transmit and the receive channel.

19. The RF radio of claim 18, wherein the at least one multiple mode RF circuit comprises a feedback loop that is coupled by the switching network between the input of the differential transistor pair and the output of the first and the second emitter-coupled transistor pairs when the multiple mode RF circuit is in mixing mode and decoupled by the switching network from the input of the differential transistor pair when the multiple mode RF circuit is in amplifier mode, and wherein the RF radio comprises an LO source coupled by the switching network to the input of the first and the second emitter-coupled transistor pairs when the multiple mode RF circuit is in mixing mode and decoupled by the switching network from the input of the first and the second emitter-coupled transistor pairs when the multiple mode RF circuit is in amplifier mode.

* * * * *